United States Patent
Kim et al.

(10) Patent No.: US 7,848,163 B2
(45) Date of Patent: Dec. 7, 2010

(54) SEMICONDUCTOR MEMORY DEVICE AND METHOD FOR DRIVING THE SAME

(75) Inventors: Kyoung-Nam Kim, Kyoungki-do (KR); Young-Jun Ku, Kyoungki-do (KR); Hoon Choi, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 559 days.

(21) Appl. No.: 11/824,359

(22) Filed: Jun. 29, 2007

(65) Prior Publication Data
US 2008/0165607 A1    Jul. 10, 2008

(30) Foreign Application Priority Data
Jan. 10, 2007    (KR) ..................... 10-2007-0002897

(51) Int. Cl.
G11C 11/063    (2006.01)
(52) U.S. Cl. ................ 365/194; 365/233.1; 365/233.12
(58) Field of Classification Search ................ 365/194, 365/229, 233.1, 233.12
See application file for complete search history.

(56) References Cited

U.S. PATENT DOCUMENTS

| | | | |
|---|---|---|---|
| 6,525,988 B2 | 2/2003 | Ryu et al. | |
| 6,650,594 B1* | 11/2003 | Lee et al. | 365/233.15 |
| 6,665,219 B2* | 12/2003 | Li et al. | 365/194 |
| 6,836,437 B2 | 12/2004 | Li et al. | |
| 2004/0212406 A1 | 10/2004 | Jung | |
| 2006/0020835 A1 | 1/2006 | Samson et al. | |
| 2006/0062056 A1* | 3/2006 | Johnson et al. | 365/189.12 |
| 2007/0069783 A1* | 3/2007 | Ku et al. | 327/158 |

FOREIGN PATENT DOCUMENTS

| | | |
|---|---|---|
| JP | 2005-251370 A | 9/2005 |
| KR | 2003-0002503 | 1/2003 |
| KR | 10-0646271 | 11/2006 |
| KR | 10-0649975 | 11/2006 |
| KR | 10-2007-0035943 | 4/2007 |

* cited by examiner

*Primary Examiner*—Vu A Le
*Assistant Examiner*—Han Yang
(74) *Attorney, Agent, or Firm*—Blakely, Sokoloff, Taylor & Zafman

(57) ABSTRACT

A semiconductor memory device includes: a delay locked loop (DLL) clock buffer for buffering a system clock in response to the a buffer enable signal; a DLL circuit for generating a delay locked loop (DLL) clock by performing a delay locking operation using the buffered system clock; and a DLL clock buffer controller for generating the buffer enable signal in response to a code signal and a clock enable signal, the code signal containing information about whether to perform the delay locking operation.

13 Claims, 5 Drawing Sheets

SEMICONDUCTOR MEMORY DEVICE AND METHOD FOR DRIVING THE SAME

CROSS-REFERENCE TO RELATED APPLICATIONS

The present invention claims priority of Korean patent application number 10-2007-0002897, filed on Jan. 10, 2007, which is incorporated by reference in its entirety.

BACKGROUND OF THE INVENTION

The present invention relates to a semiconductor memory device, and more particularly, to a delay locked loop (DLL) circuit of a semiconductor memory device.

A system is implemented with a plurality of semiconductor devices. Among them, a semiconductor memory device is used to store data. The semiconductor memory device outputs data corresponding to addresses received from a data processor, e.g., a central processing unit (CPU), or stores data received from the data processor into unit cells corresponding to addresses inputted together with the data.

As the operating speed of the system is increasing, the data processor requires the semiconductor memory device to input/output data at higher speed. As semiconductor integrated circuit (IC) technologies are rapidly developed, the operating speed of the data processor increases, but the data input/output speed of the semiconductor memory device does not keep up with the increased operating speed of the data processor.

Many attempts have been made to develop semiconductor memory devices that can increase data input/output speed up to the level required by the data processor. One of these semiconductor memory devices is a synchronous memory device that outputs data at each period of a system clock. Specifically, the synchronous memory device outputs or receives data to or from the data processor in synchronization with the system clock. However, because even the synchronous memory device could not keep up with the operating speed of the data processor, a double data rate (DDR) synchronous memory device was developed. The DDR synchronous memory device outputs or receives data at each transition of the system clock. That is, the DDR synchronous memory device outputs or receives data in synchronization with falling edges and rising edges of the system clock.

However, the system clock necessarily has a predetermined delay time until it arrives at a data output circuit because it passes through a clock input buffer, a transmission line, etc. Thus, if the data output circuit outputs data in synchronization with the delayed system clock, an external device will receive data that are not synchronized with the rising edges and the falling edges of the system clock.

To solve this problem, the semiconductor memory device uses a delay locked loop (DLL) circuit to lock a delay of a clock signal. The DLL circuit compensates for the delay caused by internal circuits of the semiconductor memory device until the system clock inputted to the semiconductor memory device is transferred to the data output circuit. The DLL circuit finds the delay time of the system clock, which is caused by the clock input buffer, the clock transmission line, etc. of the semiconductor memory device. Then, the DLL circuit delays the system clock by the found delay time and outputs the delayed system clock to the data output circuit. That is, the DLL circuit outputs the delay-locked system clock to the data output circuit. The data output circuit outputs data in synchronization with the delay-locked system clock. Therefore, it seems that the data are correctly outputted to the external circuit in synchronization with the system clock.

In an actual operation, the delay-locked system clock is transferred to the output buffer at a time point earlier by one period than a time point when the data must be outputted, and the output buffer outputs data in synchronization with the received delay locked loop (DLL) clock. Therefore, the data is output faster than the delay of the system clock caused by the internal circuit of the semiconductor memory device. In this way, it seems that the data are correctly outputted in synchronization with the rising and falling edges of the system clock inputted to the semiconductor memory device. That is, the DLL circuit is a circuit to find how fast the data must be outputted in order to compensate for the delay of the system clock within the semiconductor memory device.

Meanwhile, in a standby state where no data access operation is performed, the semiconductor memory device operates in a power down mode in order to reduce power consumption. In the power down mode, all internal circuits other than necessary circuits are disabled. The DLL circuit is also disabled in the power down mode.

Controlling the DLL circuit to be disabled in the power down mode and to be enabled during data access operation is important in reducing the power consumption. Because the DLL circuit uses the clock, it consumes a large amount of current during operations. Therefore, unnecessary current consumption can be reduced by, if unnecessary, disabling the DLL circuit.

SUMMARY OF THE INVENTION

Embodiments of the present invention are directed at providing a semiconductor memory device having a DLL circuit, which can minimize current consumption in a power down mode.

In accordance with an aspect of the present invention, there is provided a semiconductor memory device, including: a delay locked loop (DLL) clock buffer for buffering a system clock in response to a buffer enable signal; a DLL circuit for generating a delay locked loop (DLL) clock by performing a delay locking operation using the buffered system clock; and a DLL clock buffer controller for generating the buffer enable signal in response to a code signal and a clock enable signal, the code signal containing information about whether to perform the delay locking operation.

In accordance with another aspect of the present invention, there is provided a method for driving a semiconductor memory device, including: generating a buffer enable signal using a code signal and a clock enable signal, the code signal containing information about whether to perform a delay locking operation; buffering a system clock in response to the buffer enable signal; and generating a delay locked loop (DLL) clock by performing the delay locking operation using the buffered system clock.

In accordance with further another aspect of the present invention, there is provided a semiconductor memory device, including: a register for storing a code signal containing information about whether to perform a delay locking operation; a delay locked loop (DLL) circuit for generating a delay locked loop (DLL) clock by performing the delay locking operation using the code signal and a clock enable signal.

DESCRIPTION OF SPECIFIC EMBODIMENTS

Figure 1:
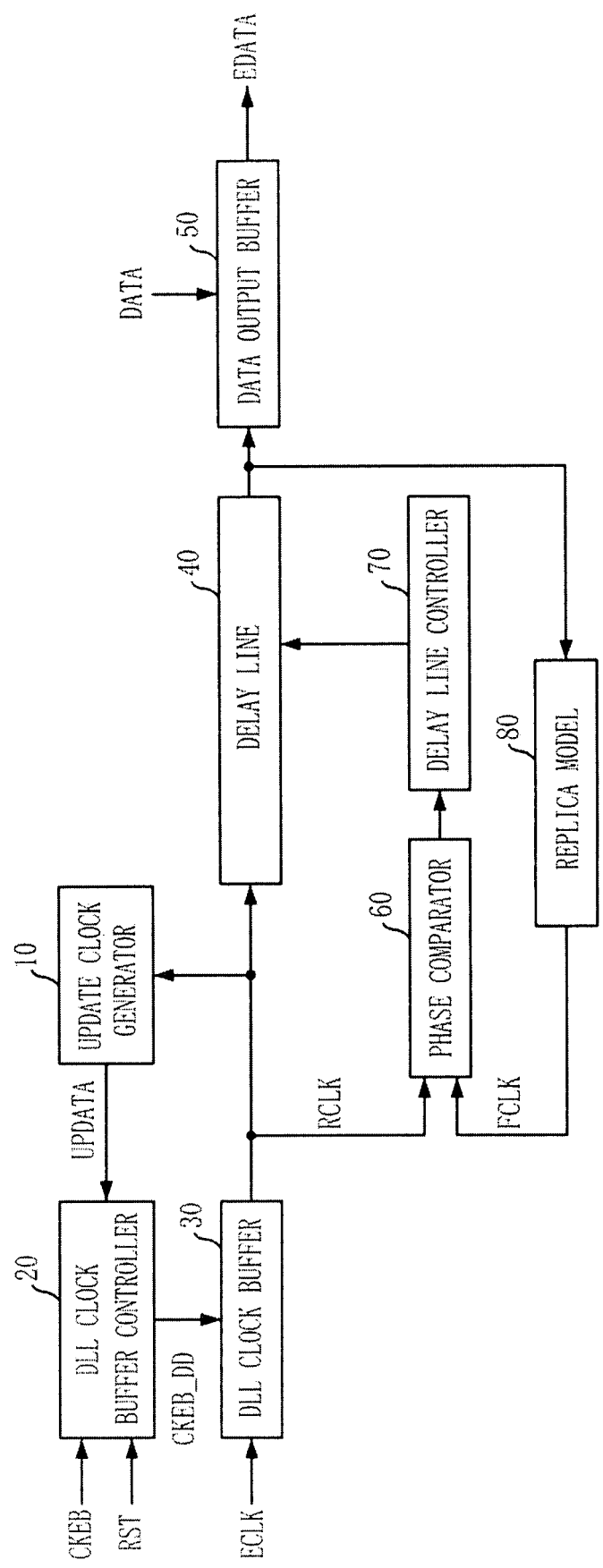
FIG. 1 is a block diagram of a delay locked loop (DLL) circuit of a semiconductor memory device.

FIG. 1 is a block diagram of a delay locked loop (DLL) circuit of a semiconductor memory device.

Referring to FIG. 1, the semiconductor memory device includes an update clock generator 10, a DLL clock buffer controller 20, a DLL clock buffer 30, a delay line 40, a data output buffer 50, a phase comparator 60, a delay line controller 70, and a replica model 80.

The update clock generator 10 receives an external system clock ECLK to generate an update clock UPDATE. The update clock UPDATE has half period of the external system clock ECLK and is clocked one time in every 11 periods of the external system clock ECLK. The DLL clock buffer controller 20 receives a clock enable signal CKEB to generate an enable signal CKEB_DD in synchronization with the update clock UPDATE. The DLL clock buffer controller 20 is reset by a reset signal RST. The DLL clock buffer 30 receives the external system clock ECLK to generate a reference clock RCLK.

The delay line 40 delays the reference clock RCLK by a delay time corresponding to a control signal output from the delay line controller 70. The data output buffer 50 outputs data EDATA provided from a memory core in synchronization with a delay locked loop (DLL) clock output from the delay line 40. The phase comparator 60 compares a phase of the reference clock RCLK with a phase of a feedback clock FCLK. The delay line controller 70 outputs the control signal according to the comparison result. The replica model 80 outputs the feedback clock FCLK by delaying the output signal of the delay line 40 by a modeled delay value. The modeled delay value means a delay value corresponding to a path until the clock signal is transferred to the data output buffer after it is input to the semiconductor memory device.

The phase comparator 60 compares the phase of the reference clock RCLK output from the DLL clock buffer 30 with the phase of the feedback clock FCLK delayed by a predefined value in the delay line 40 and the replica model 80. The delay line controller 70 controls the value used when the delay line 40 delays the reference clock RCLK according to the comparison result. This process is performed until the phase of the reference clock RCLK becomes equal to the phase of the feedback clock FCLK inputted to the phase comparator 60. When the phases of the two clocks RCLK and FCLK inputted to the phase comparator 60 are equal to each other, the delay line controller 70 locks the delay value used when the delay line 40 delays the reference clock RCLK. This state is called a delay locked state. A clock output from the delay line 40 in this state is called a delay locked loop (DLL) clock. The data output buffer 50 outputs the data EDATA in synchronization with the DLL clock.

The update clock generator 10 generates the update clock UPDATE to the DLL clock buffer 20. The update clock UPDATE is a clock used for the updating operation of the DLL circuit. Specifically, the update clock UPDATE is used to update the operation state of the DLL circuit immediately when the semiconductor memory device enters the power down mode. In the power down mode, the DLL clock buffer controller 20 receives the clock enable signal CKEB and disables the DLL clock buffer 30 by deactivating the enable signal CKEB_DD in synchronization with the update clock UPDATE. The clock enable signal CKEB is a signal deactivated to a logic high level when the semiconductor memory device enters the power down mode.

Figure 2:
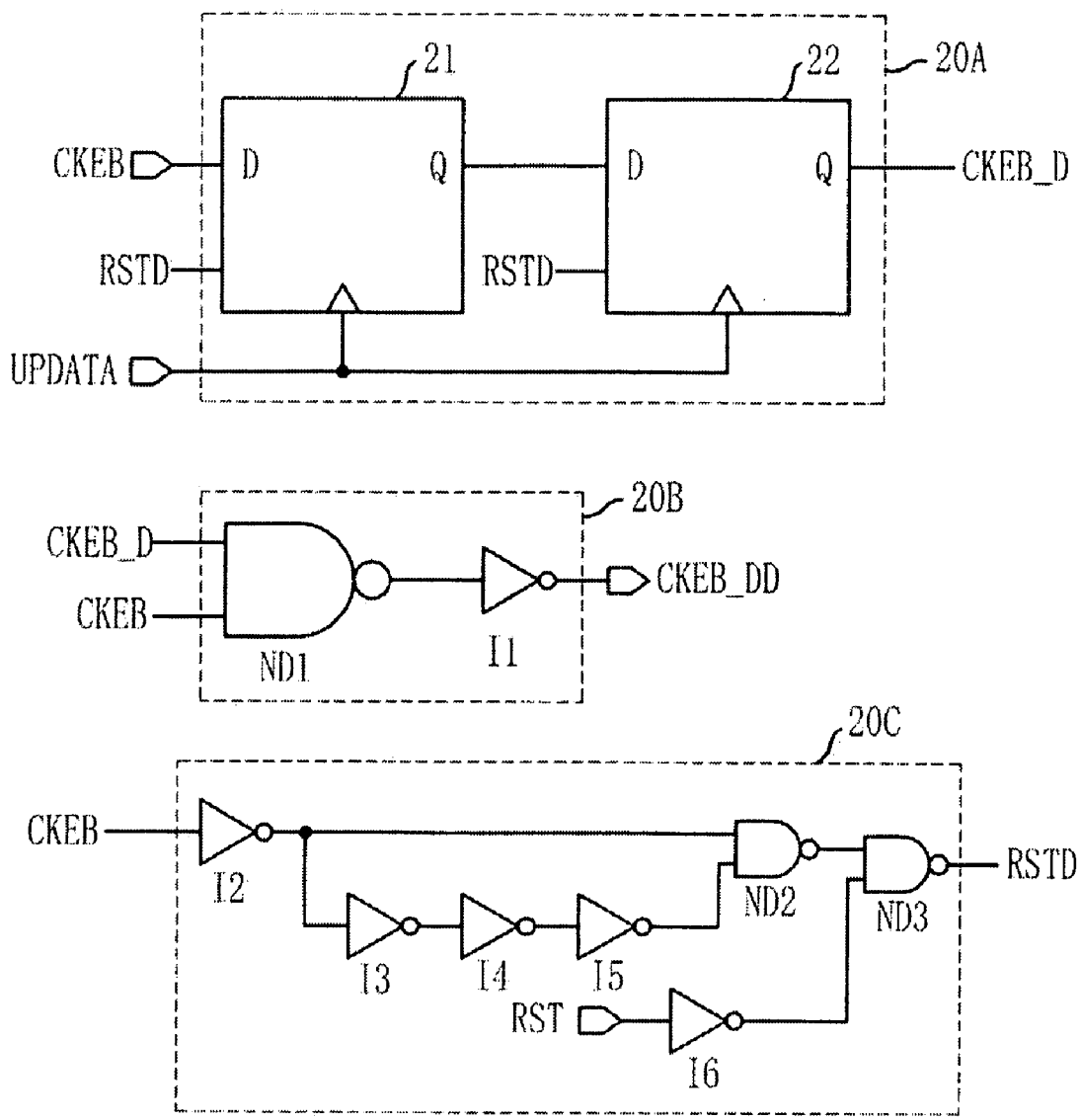
FIG. 2 is a circuit diagram of a DLL clock buffer controller shown in FIG. 1.

FIG. 2 is a circuit diagram of circuit diagram of the DLL clock buffer controller 20 shown in FIG. 1.

Referring to FIG. 2, the DLL clock buffer controller 20 includes a clock synchronization unit 20A, an enable signal generation unit 20B, and a reset control unit 20C. The clock synchronization unit 20A includes a first flip-flop 21 and a second flip-flop 22. The first flip-flop 21 receives the clock enable signal CKEB in synchronization with the update clock UPDATE. The second flip-flop 22 outputs a clock-synchronized enable signal CKEB_D by synchronizing the output signal of the first flip-flop 21 with the update clock UPDATE. The enable signal generation unit 20B includes a first NAND gate ND1 and a first inverter I1. The first NAND gate ND1 receives the clock-synchronized enable signal CKEB_D and the clock enable signal CKEB, and the first inverter I1 inverts an output signal of the first NAND gate ND1. The reset control unit 20C includes second to fifth inverters I2 to I5, a second NAND gate ND2, a sixth inverter I6, and a third NAND gate ND3. The second to fifth inverters I2 to I5 and the second NAND gate ND2 generate a pulse corresponding to a transition time point of the clock enable signal CKEB. The sixth inverter I6 inverts the reset signal RST. The third NAND gate ND3 receives the outputs of the second NAND gate ND2 and the sixth inverter I6 to output a reset pulse RSTD.

The reset control unit 20C generates the reset pulse RSTD serving as the reset signal of the first and second flip-flops 21 and 22 of the clock synchronization unit 20A. The clock synchronization unit 20A generates the clock-synchronized enable signal CKEB_D by synchronizing the clock enable signal CKEB in response to the transition of the update clock UPDATE. The update clock UPDATE has two times the period of the system clock ECLK and is generated at every 11 periods of the system clock ECLK. Therefore, after the clock enable signal is activated and the system clock ECLK is clocked 22-44 times, the clock-synchronized enable signal CKEB_D is activated. The enable signal generation unit 20B performs the logical AND operation on the clock enable signal CKEB and the clock-synchronized enable signal CKEB_D to activate the enable signal CKE_DD to a logic low level. When the enable signal CKE_DD is activated to the logic low level, the DLL clock buffer 30 is disabled so that it does not receive the system clock ECLK any more. Consequently, unnecessary current consumption of the DLL circuit can be prevented because the DLL circuit stops the delay locking operation in the power down mode.

When the deactivated clock enable signal CKE is input, the DLL clock buffer 30 is not immediately disabled. The reason for this is that the DLL stores the status value when it enters the power down mode without stopping the delay locking operation and uses the previous information when it exits the power down mode.

Figure 3:
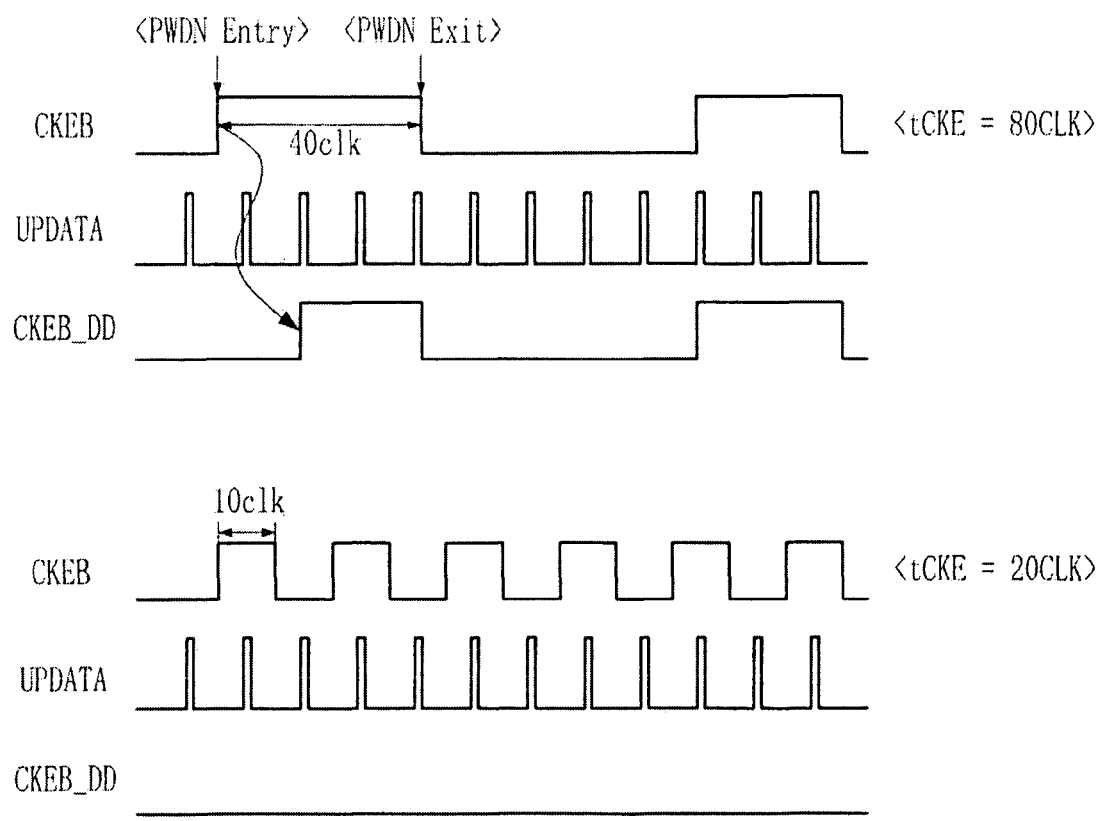
FIG. 3 is a waveform diagram illustrating an operation of the DLL circuit shown in FIG. 1.

FIG. 3 is a waveform diagram illustrating an operation of the DLL circuit shown in FIG. 1. Specifically, FIG. 3 illustrates the case where the clock enable signal CKEB is deactivated during 80 periods of the system clock ECLK and the case where the clock enable signal CKEB is deactivated during 20 periods of the system clock ECLK.

In the case where the clock enable signal CKEB is deactivated during 80 periods of the system clock ECLK, the DLL circuit enters the power down mode and the clock enable signal CKEB is deactivated to a logic high level. Then, the enable signal CKE_DD is activated to a logic high level at a timing when the update clock UPDATE is clocked two times. Thereafter, when the DLL circuit exits the power down mode, the clock enable signal CKEB is deactivated to a logic low level.

In the case where the clock enable signal CKEB is deactivated during 20 periods of the system clock ECLK, the clock enable signal CKEB is already deactivated to a logic high level at a timing when the update clock UPDATE is clocked two times after the clock enable signal CKEB is deactivated to a logic high level. Thus, the enable signal CKE_DD is not activated to a logic high level. Therefore, even when the DLL circuit enters the power down mode, it does not stop the delay locking operation when it exits the power down mode within a predetermined clock number of the system clock ECLK. This is because it is less efficient to stop and resume the delay locking operation when the DLL circuit performs the power-down-mode operation during a relatively short duration.

Meanwhile, the DLL circuit does not always operate. For example, when the frequency of the system clock inputted to the semiconductor memory device is relatively high, the data are outputted in synchronization with the system clock, instead of the DLL clock. In this case, the DLL clock buffer 30, the delay line 40, and the data output buffer 50, which correspond to the data path, are operated, while the phase comparator 60, the delay line controller 70, and the replica model 80 are not operated. In addition, the update clock generator 10 does not generate the update clock UPDATE. Consequently, the DLL clock buffer controller 20 does not generate the clock-synchronized enable signal CKEB_D, so that the enable signal CKEB_DD is not activated to a logic high level. In this case, even though the DLL circuit enters the power down mode, the DLL clock buffer 30 is not deactivated. Therefore, a large amount of a current is consumed due to the operation of the DLL clock buffer 30 when the DLL circuit enters the power down mode. This is because the delay locking operation is not performed and the update clock UPDATE is not generated, so that the enable signal CKEB_DD is not activated.

Figure 4:
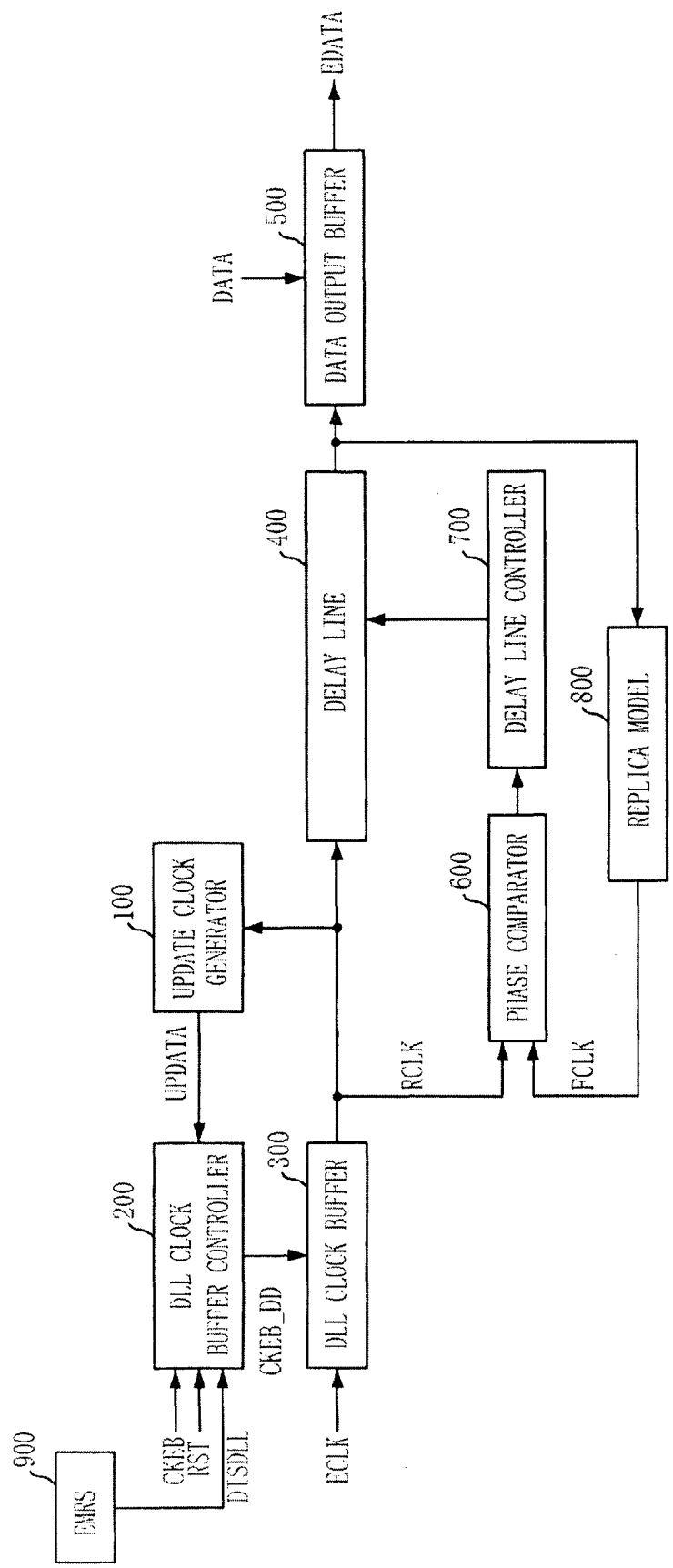
FIG. 4 is a block diagram of a DLL circuit of a semiconductor memory device in accordance with an embodiment of the present invention.

FIG. 4 is a block diagram of a DLL circuit of a semiconductor memory device in accordance with an embodiment of the present invention.

Referring to FIG. 4, the semiconductor memory device includes an update clock generator 100, a DLL clock buffer controller 200, a DLL clock buffer 300, a delay line 400, a data output buffer 500, a phase comparator 600, a delay line controller 700, and a replica model 800. All blocks other than the DLL clock buffer 200 have the same structure as those of FIG. 1.

The DLL clock buffer 200 receives a code signal DISDLL from an extended mode register set (EMRS) 900. The code signal DISDLL contains information about whether to perform a delay locking operation. In some cases, the semiconductor memory device does not need the delay locking operation of the DLL circuit according to the operating frequency. In this case, the code signal DISDLL maintains a deactivated state. On the other hand, when the DLL circuit needs to perform the delay locking operation, the code signal DISDLL maintains the activated state. The EMRS storing the code signal DISDLL is a register storing information about the operation mode of the semiconductor memory device.

Even when the DLL circuit does not perform the delay locking operation, the DLL clock buffer 300 and the delay line 400 are operated in order to transfer an external system clock ECLK to the data output buffer 500. When the DLL circuit does not perform the delay locking operation, the update clock generator 100 maintains the deactivated state, so that an update clock UPDATE is not generated. When the semiconductor memory device enters a power down mode in such a state that the DLL circuit does not perform the delay locking operation, a clock enable signal CKEB is activated and input to the DLL clock buffer controller 200.

When the semiconductor memory device shown in FIG. 1 enters the power down mode, the DLL clock buffer controller 200 continues to generate a buffer enable signal CKEB_DD even though the activated clock enable signal CKEB is input.

However, when the semiconductor memory device shown in FIG. 4 of the present invention enters the power down mode, the DLL clock buffer controller 200 generates the buffer enable signal CKEB_DD using the clock enable signal CKEB and the code signal DISDLL containing the information about whether to perform the delay locking operation. Therefore, when the semiconductor memory device enters the power down mode in such a state that the DLL circuit does not perform the delay locking operation, the buffer enable signal CKEB_DD is deactivated. Specifically, the DLL clock buffer controller 200 deactivates the buffer enable signal CKEB_DD in synchronization with the update clock UPDATE, while the delay locking operation is performed. On the other hand, the DLL clock buffer controller 200 deactivates the buffer enable signal CKEB_DD in response to the code signal DISDLL, while the delay locking operation is not performed.

Figure 5:
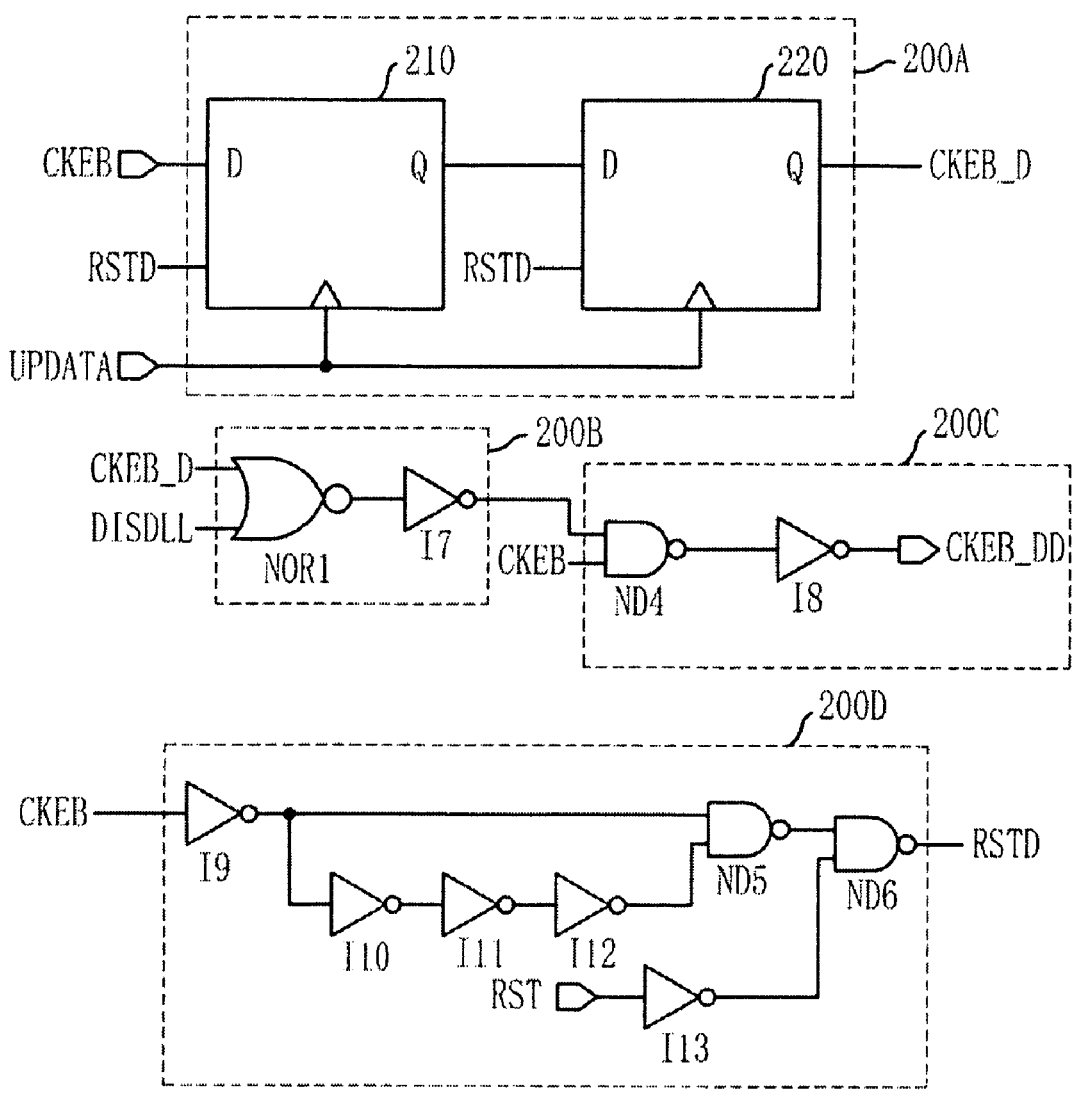
FIG. 5 is a circuit diagram of a DLL clock buffer controller shown in FIG. 4.

FIG. 5 is a circuit diagram of the DLL clock buffer controller 200 shown in FIG. 4.

Referring to FIG. 4, the DLL clock buffer controller 200 includes a clock synchronization unit 200A, a first gate unit 200B, a second gate unit 200C. The clock synchronization unit 200A generates an internal clock enable signal CKEB_D by synchronizing the clock enable signal CKEB with the update clock UPDATE. The first gate unit 200B performs a logical OR operation on the internal clock enable signal CKEB_D and the code signal DISDLL. The second gate unit 200C performs a logical AND operation on an output signal of the first gate unit 200B and the clock enable signal CKEB to output the buffer enable signal CKEB_DD. In addition, the DLL clock buffer controller 200 includes a reset pulse generation unit 200D for combining the enable signal CKEB and a reset signal RST to generate a reset pulse RSTD for resetting the clock synchronization unit 200A.

The clock synchronization unit 200A includes a first flip-flop 210 and a second flip-flop 220. The first flip-flop 210 receives the update signal UPDATE as a clock input signal and the clock enable signal CKEB as a data input signal D. The second flip-flop 220 receives the update clock UPDATE as a clock input signal and an output signal of the first flip-flop 210 as a data input signal to output the internal clock enable signal CKEB_D.

The clock synchronization unit 200A generates the internal clock enable signal CKEB_D by synchronizing the clock enable signal CKEB with the update clock UPDATE. The first gate unit 200B a high-level signal in response to the internal clock enable signal CKEB_D of a logic high level or the code signal DISDLL of a logic high level. When both the output signal of the first gate unit 200B and the clock enable signal CKEB are in a logic high level, the second gate unit 200C outputs the buffer enable signal CKEB_DD of a logic high level. When the high of a logic high level is output, the DLL clock buffer 300 maintains a deactivated state.

as described above, when the clock enable signal CKEB is deactivated to a logic high level in such a state that the delay locking operation is performed, the internal clock enable signal CKEB_D is generated so that the second gate unit 200C outputs a logic high level. Meanwhile, in such a state that the delay locking operation is not performed, the second gate unit 200C outputs a logic high level in response to the code signal DISDLL. Therefore, the buffer enable signal CKEB_DD is deactivated, when the semiconductor memory device enters the power down mode regardless of whether the delay locking operation is performed or not. Once the semiconductor memory device enters the power down mode, the DLL clock buffer is not operated, whether the semiconductor memory device performs the delay locking operation or not. Consequently, in the power mode, unnecessary current consumption can be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a delay locked loop (DLL) clock buffer for buffering a system clock in response to a buffer enable signal;
    a DLL circuit for generating a delay locked loop (DLL) clock by performing a delay locking operation in response to the buffered system clock;
    an update clock generator for generating an update clock for updating delay-locking information in response to the buffered system clock; and
    a DLL clock buffer controller for generating the buffer enable signal in synchronization with the update clock or in response to a code signal and a clock enable signal, the code signal containing information about, whether to perform the delay locking operation.

2. The semiconductor memory device as recited in claim 1, wherein the code signal is stored in an extended mode register set (EMRS).

3. The semiconductor memory device as recited in claim 2, wherein the DLL clock buffer controller comprises:
    a clock synchronization unit for generating an internal clock enable signal by synchronizing the clock enable signal with an update clock;
    a first gate unit for performing a logical OR operation on the internal clock enable signal and the code signal; and
    a second gate unit for performing a logical AND operation on an output signal of the first gate unit and the clock enable signal to output the buffer enable signal.

4. The semiconductor memory device as recited in claim 3, wherein the DLL clock buffer controller further comprises a reset pulse generation unit for combining the clock enable signal and a reset signal to generate a reset pulse for resetting the clock synchronization unit.

5. The semiconductor memory device as recited in claim 3, wherein the clock synchronization unit comprises:
    a first flip-flop for receiving the update clock as a clock input signal and the clock enable signal as a data input signal; and
    a second flip-flop for receiving the update clock as a clock input signal and an output signal of the first flip-flop as a data input signal to output the internal clock enable signal.

6. A method for driving a semiconductor memory device, comprising:
    generating a buffer enable signal in synchronization with an update clock or in response to a code signal and a clock enable signal, the code signal containing information about whether to perform a delay locking operation;
    buffering a system clock in response to the buffer enable signal;
    generating the update clock for updating delay locking information in response to the buffered system clock; and
    generating a delay locked loop (DLL) clock by performing the delay locking operation using the buffered system clock.

7. The method as recited in claim 6, wherein the code signal is stored in an extended mode register set (EMRS).

8. The method as recited in claim 6, wherein the generating of the buffer enable signal comprises:
    generating an internal clock enable signal by synchronizing the clock enable signal with the update clock;
    performing a logical OR operation on the internal clock enable signal and the code signal; and
    performing a logical AND operation on the ORed signal and the clock enable signal to output the buffer enable signal.

9. A semiconductor memory device, comprising:
    a register for storing a code signal containing information about whether to perform a delay locking operation;
    a delay locked loop (DLL) circuit for generating a delay locked loop (DLL) clock by performing the delay locking operation in response to the code signal and a clock enable signal
    wherein the DLL circuit comprises:
    a DLL clock buffer controller for generating a buffer enable signal in synchronization with an update clock or in response to the code signal and the clock enable signal;
    a DLL clock buffer for buffering a system clock in response to the buffer enable signal;
    an update clock generator for generating the update clock for updating delay-locking information in response to the buffered system clock; and
    a delay unit for generating the DLL clock by performing the delay locking operation in response to the buffered system clock.

10. The semiconductor memory device as recited in claim 9, wherein the register includes an extended mode register set (EMRS).

11. The semiconductor memory device as recited in claim 9, wherein the DLL clock buffer controller comprises:
    a clock synchronization unit for generating an internal clock enable signal by synchronizing the clock enable signal with the update clock;
    a first gate unit for performing a logical OR operation on the internal clock enable signal and the code signal; and
    a second gate unit for performing a logical AND operation on an output signal of the first gate unit and the clock enable signal to output the buffer enable signal.

12. The semiconductor memory device as recited in claim 11, wherein the DLL clock buffer controller further comprises a reset pulse generation unit for combining the clock enable signal and a reset signal to generate a reset pulse for resetting the clock synchronization unit.

13. The semiconductor memory device as recited in claim 11, wherein the clock synchronization unit comprises:
    a first flip-flop for receiving the update signal as a clock input signal and the clock enable signal as a data input signal; and
    a second flip-flop for receiving the update clock as a clock input signal and an output signal of the first flip-flop as a data input signal to output the internal clock enable signal.

* * * * *